(12) United States Patent
Kato et al.

(10) Patent No.: US 10,490,724 B2
(45) Date of Patent: *Nov. 26, 2019

(54) PELTIER COOLING ELEMENT AND METHOD FOR MANUFACTURING SAME

(71) Applicant: LINTEC CORPORATION, Itabashi-ku (JP)

(72) Inventors: Kunihisa Kato, Warabi (JP); Tsuyoshi Mutou, Saitama (JP); Wataru Morita, Saitama (JP); Yuma Katsuta, Gyoda (JP); Takeshi Kondo, Saitama (JP)

(73) Assignee: LINTEC CORPORATION, Itabashi-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/538,337

(22) PCT Filed: Dec. 24, 2015

(86) PCT No.: PCT/JP2015/086045
§ 371 (c)(1),
(2) Date: Jun. 21, 2017

(87) PCT Pub. No.: WO2016/104615
PCT Pub. Date: Jun. 30, 2016

(65) Prior Publication Data
US 2017/0373240 A1    Dec. 28, 2017

(30) Foreign Application Priority Data

Dec. 26, 2014 (JP) .................................. 2014-265650

(51) Int. Cl.
*H01L 35/26* (2006.01)
*F25B 21/02* (2006.01)
(Continued)

(52) U.S. Cl.
CPC .............. *H01L 35/26* (2013.01); *F25B 21/02* (2013.01); *H01L 35/16* (2013.01); *H01L 35/24* (2013.01); *H01L 35/32* (2013.01); *H01L 35/34* (2013.01)

(58) Field of Classification Search
CPC ......... F25B 21/02; H01B 35/26; H01B 35/34; H01B 35/24; H01B 35/16
See application file for complete search history.

(56) References Cited

U.S. PATENT DOCUMENTS

2003/0032709 A1   2/2003   Toshima et al.
2013/0333738 A1   12/2013  Suemori et al.
(Continued)

FOREIGN PATENT DOCUMENTS

EP   2 884 550 A1   6/2015
JP   2003-46145 A   2/2003
(Continued)

OTHER PUBLICATIONS

Extended European Search Report dated Jul. 28, 2018 in Patent Application No. 15873183.6, 6 pages.
(Continued)

*Primary Examiner* — Brian M King
(74) *Attorney, Agent, or Firm* — Oblon, McClelland, Maier & Neustadt, L.L.P.

(57) ABSTRACT

To provide a Peltier cooling element that is excellent in thermoelectric performance and flexibility and can be manufactured easily at low cost. A Peltier cooling element containing a thermoelectric conversion material containing a support having thereon a thin film containing a thermoelectric semiconductor composition containing thermoelectric semiconductor fine particles, a heat resistant resin, and an ionic liquid, and a method for manufacturing a Peltier cooling element containing a thermoelectric conversion
(Continued)

material containing a support having thereon a thin film containing a thermoelectric semiconductor composition containing thermoelectric semiconductor fine particles, a heat resistant resin, and an ionic liquid, the method containing: coating a thermoelectric semiconductor composition containing thermoelectric semiconductor fine particles, a heat resistant resin, and an ionic liquid, on a support, and drying, so as to form a thin film; and subjecting the thin film to an annealing treatment.

12 Claims, 1 Drawing Sheet

(51) Int. Cl.
*H01L 35/24* (2006.01)
*H01L 35/34* (2006.01)
*H01L 35/16* (2006.01)
*H01L 35/32* (2006.01)

(56) References Cited

U.S. PATENT DOCUMENTS

2014/0360550 A1* 12/2014 Wu .................... B82Y 30/00
136/230
2015/0004733 A1* 1/2015 Wang .................... C01B 19/007
438/54
2015/0228879 A1 8/2015 Kato et al.
2015/0255698 A1* 9/2015 Maekawa ............... H01L 35/26
136/225

FOREIGN PATENT DOCUMENTS

| JP | 2003046145 A | * | 2/2003 |
| JP | 2008-266401 A | | 11/2008 |
| JP | 2010-199276 A | | 9/2010 |
| JP | 2014-199836 A | | 10/2014 |
| JP | 2014199836 A | * | 10/2014 |
| TW | 201332170 A1 | | 8/2013 |

OTHER PUBLICATIONS

D. Madan, et al., "Dispenser printed composite thermoelectric thick films for thermoelectric generator applications", Journal of Applied Physics, vol. 109, 034904, 2011, (7 pages).
International Search Report dated Mar. 22, 2016 in PCT/JP2015/086045, filed on Dec. 24, 2015.
Combined Office Acton and Search Report dated Feb. 22, 2019 in Taiwanese Patent Application No. 104143852, 9 pages (with English translation of categories of cited documents).

* cited by examiner

PELTIER COOLING ELEMENT AND METHOD FOR MANUFACTURING SAME

CROSS-REFERENCE TO RELATED APPLICATIONS

This application is a National Stage of PCT/JP2015/086045, which was filed on Dec. 24, 2015. This application is based upon and claims the benefit of priority to Japanese Application No. 2014-265650, which was filed on Dec. 26, 2014.

TECHNICAL FIELD

The present invention relates to a Peltier cooling element using a thermoelectric conversion material performing mutual energy conversion between heat and electricity.

BACKGROUND ART

As an energy conversion technology utilizing thermoelectric conversion, a thermoelectric power generation technology and a Peltier cooling technology have been known. The thermoelectric power generation technology is a technology that utilizes conversion from thermal energy to electric energy through the Seebeck effect, and the technology is attracting increasing attention particularly as an energy saving technology capable of recovering, as electric energy, unused waste heat energy formed from the fossil fuel resources or the like used in buildings, factories, and the like. The Peltier cooling technology is a technology that utilizes conversion from electric energy to thermal energy through the Peltier effect in contrast to the thermoelectric power generation, and the technology is being used in a wine refrigerator, a small portable refrigerator, cooling for a CPU used in a computer or the like, and a component or device that requires precise temperature control, such as temperature control of a semiconductor laser oscillator for optical communication. However, the technologies have a low thermoelectric conversion efficiency, and the practical applications thereof are still limited to the aforementioned fields.

In recent years, while it is common that an electronic device has mounted thereon a semiconductor element relating to the operation and control thereof, the semiconductor element is heated to a high temperature and becomes by itself a heat generator radiating a large amount of heat, due to the reduction in size thereof through miniaturization, the enhancement of the performance thereof, and the like. Under the circumstances, a cooling device that efficiently absorbs heat from the semiconductor element is demanded to be reduced in size.

One measure therefor is electronic cooling utilizing the Peltier cooling technology, but an ordinary Peltier element is a thermoelectric element that uses a sintered material of a thermoelectric material, which results in limitation in the aspects of the mechanical strength in size reduction, the installation mode on a surface of a heat generator (for example, mounting on a flexural area), the precision, and the like, and therefore it is demanded to provide a Peltier element in a sheet form including the formation of a thin film of a thermoelectric material by a coating process, such as printing, and the flexibility of the element.

The thermoelectric conversion utilizes the physical phenomena that are peculiar to materials, such as the Seebeck effect and the Peltier effect, as described above. However, for enhancing the efficiency of thermoelectric conversion, it is necessary to develop a thermoelectric conversion material having a high performance. The thermoelectric conversion efficiency can be evaluated by the figure of merit Z ($Z=\sigma S^2/\lambda = \sigma \Pi^2/\lambda T^2$). Herein, S represents the Seebeck coefficient, $\Pi$ represents the Peltier coefficient, $\sigma$ represents the electroconductivity (which is the inverse of the resistivity), $\lambda$ represents the thermal conductivity, and T represents the absolute temperature of the junction part. In view of this, for enhancing the efficiency of cooling, it is important to find a thermoelectric conversion material that has a large Seebeck coefficient S relating to power generation, a large Peltier coefficient $\Pi$ relating to cooling (the Peltier coefficient and the Seebeck coefficient are in proportional relationship assuming that T is constant), a large electroconductivity $\sigma$, and a small thermal conductivity $\lambda$.

Under the circumstances, PTL 1 describes a method for manufacturing a thermoelectric conversion element aiming the enhancement of the power generation efficiency and the efficient production thereof, in which solutions having insulating property providing materials of p-type and n-type organic semiconductor elements are coated or printed on a support, and then dried. NPL 1 describes investigations of production of a thin film thermoelectric conversion element, in which a composition containing bismuth telluride dispersed in an epoxy resin as a thermoelectric conversion material is formed into a film by coating. PTL 2 describes investigations of a thermoelectric material, in which an organic thermoelectric material, such as a polythiophene or a derivative thereof, and an inorganic thermoelectric material, are integrated as a dispersed state.

CITATION LIST

Patent Literatures

PTL 1: JP-A 2010-199276
PTL 2: JP-A 2003-46145

Non-Patent Literature

NPL 1: D. Madan, Journal of Applied Physics, 2011, 109, 034904

SUMMARY OF INVENTION

Technical Problem

However, PTL 1 uses p-type and n-type organic semiconductor elements as the thermoelectric material, and is insufficient in thermoelectric conversion characteristics. In the thin film thermoelectric conversion element of NPL 1, a heat treatment is performed at a high temperature exceeding the decomposition temperature of the binder, which only results in flexibility equivalent to bismuth telluride that is formed into a film by itself, and furthermore the thermoelectric conversion characteristics are insufficient. In the case where the thermoelectric material of PTL 2 is formed into a thin film and then subjected to a heat treatment at a temperature exceeding the decomposition temperature of the organic thermoelectric material, for further enhancing the thermoelectric conversion characteristics, the organic thermoelectric material may be lost to provide a possibility of reduction of the thermoelectric conversion characteristics.

In view of the aforementioned circumstances, an object of the present invention is to provide a Peltier cooling element that is excellent in thermoelectric performance and flexibility and can be manufactured easily at low cost.

Solution to Problem

As a result of earnest investigations made by the present inventors for solving the problem, it has been found that a Peltier cooling element that is constituted by using a thermoelectric conversion material containing a support having thereon a thin film containing a thermoelectric semiconductor composition containing a thermoelectric semiconductor formed into fine particles contributing to reduction of the thermal conductivity, a heat resistant resin, and an ionic liquid suppressing the electroconductivity in voids among the fine particles from being decreased has a higher thermoelectric performance, i.e., a higher cooling performance as a Peltier element, than the case using the ordinary thermoelectric conversion material, and furthermore is excellent in flexibility, and thus the present invention has been completed.

Accordingly, the present invention provides the following items (1) to (13).

(1) A Peltier cooling element containing a thermoelectric conversion material containing a support having thereon a thin film containing a thermoelectric semiconductor composition containing thermoelectric semiconductor fine particles, a heat resistant resin, and an ionic liquid.

(2) The Peltier cooling element according to the item (1), wherein an amount of the ionic liquid mixed is from 0.01 to 50% by mass in the thermoelectric semiconductor composition.

(3) The Peltier cooling element according to the item (1) or (2), wherein the cation component of the ionic liquid contains at least one selected from a pyridinium cation and a derivative thereof, and an imidazolium cation and a derivative thereof.

(4) The Peltier cooling element according to the item (1) or (2), wherein the anion component of the ionic liquid contains a halide anion.

(5) The Peltier cooling element according to the item (4), wherein the halide anion contains at least one selected from $Cl^-$, $Br^-$, and $I^-$.

(6) The Peltier cooling element according to the item (1), wherein the heat resistant resin is at least one selected from a polyamide resin, a polyamideimide resin, a polyimide resin, and an epoxy resin.

(7) The Peltier cooling element according to the item (1), wherein an amount of the thermoelectric semiconductor fine particles mixed is from 30 to 99% by mass in the thermoelectric semiconductor composition.

(8) The Peltier cooling element according to any one of the items (1) to (7), wherein a mean particle size of the thermoelectric semiconductor fine particles is from 10 nm to 200 μm.

(9) The Peltier cooling element according to any one of the items (1) to (8), wherein the thermoelectric semiconductor fine particles are fine particles of a bismuth-tellurium-based thermoelectric semiconductor material.

(10) The Peltier cooling element according to any one of the items (1) to (9), wherein the support is a plastic film.

(11) The Peltier cooling element according to the item (10), wherein the plastic film is at least one selected from a polyimide film, a polyamide film, a polyetherimide film, a polyaramid film, and a polyamideimide film.

(12) A method for manufacturing a Peltier cooling element containing a thermoelectric conversion material containing a support having thereon a thin film containing a thermoelectric semiconductor composition containing thermoelectric semiconductor fine particles, a heat resistant resin, and an ionic liquid, the method containing: coating a thermoelectric semiconductor composition containing thermoelectric semiconductor fine particles, a heat resistant resin, and an ionic liquid, on a support, and drying, so as to form a thin film; and subjecting the thin film to an annealing treatment.

(13) The method for manufacturing a Peltier cooling element according to the item (12), wherein the support is a plastic film.

Advantageous Effects of Invention

According to the present invention, a Peltier cooling element can be provided that is excellent in thermoelectric performance and flexibility and can be manufactured easily at low cost.

DESCRIPTION OF EMBODIMENTS

Peltier Cooling Element

The Peltier cooling element of the present invention is constituted by using a thermoelectric conversion material containing a support having thereon a thin film containing a thermoelectric semiconductor composition containing thermoelectric semiconductor fine particles, a heat resistant resin, and an ionic liquid.

In a Peltier cooling element, in general, a p-type thermoelectric element and an n-type thermoelectric element are connected in series via an electrode, and an electric current is made to flow in the p-n junction, whereby a heat absorption phenomenon occurs in an n-p junction part (the electric current flows in the direction from n to p), whereas a heat radiation phenomenon occurs in a p-n junction part (the electric current flows in the direction from p to n) through a Peltier effect. According to the phenomena, heat can be transported from the low temperature side (i.e., the heat absorption side) to the high temperature side (i.e., the heat generation side).

In a Pelter cooling element, the reversed flow of heat from the high temperature side to the low temperature side through the interior of the element is increased when the temperature difference between the high temperature side and the low temperature side is increased (increment of reversed flow=thermal conductivity of module×increment of temperature difference), and therefore a larger cooling effect is obtained with a smaller temperature difference between the heat generation side and the heat absorption side.

Figure 1:
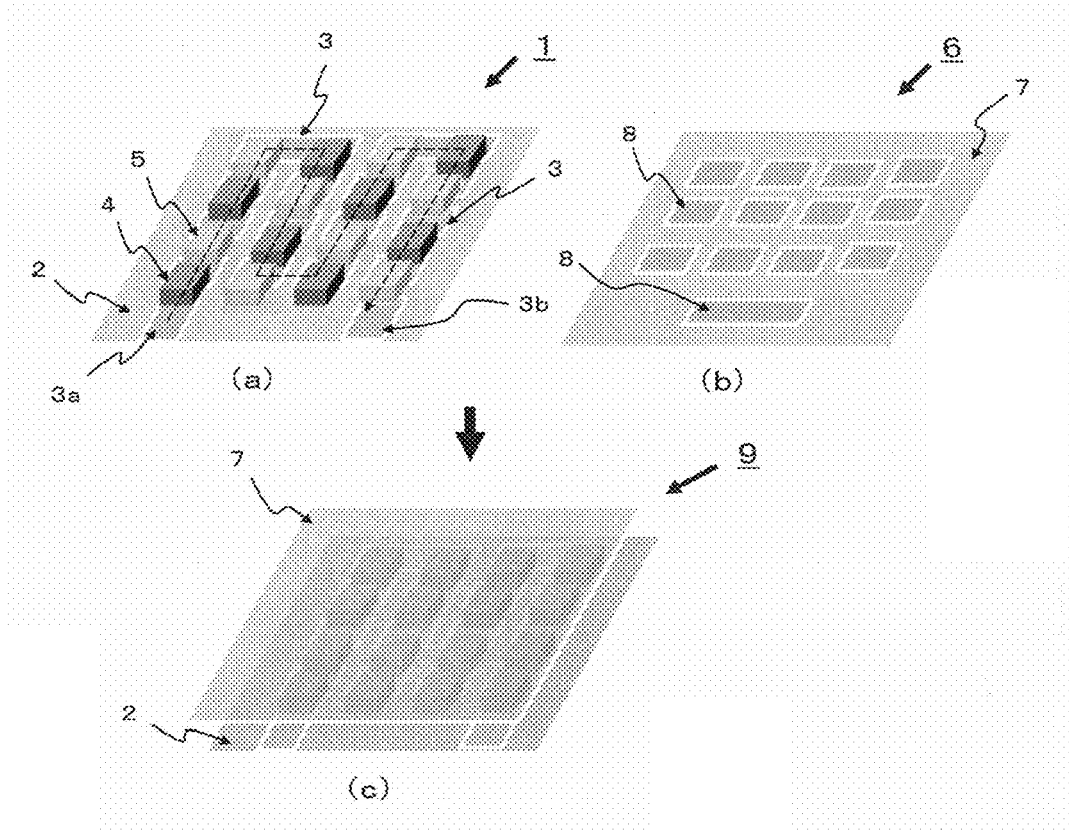
FIG. 1 shows perspective views showing one example of the structure of the Peltier cooling element of the present invention, in which (a) is a perspective view showing one example of a coating pattern of electrodes provided on a support in advance (which may be hereinafter referred to as "lower electrodes") and a coating pattern of p-type and n-type thermoelectric elements, (b) is a perspective view showing one example of a coating pattern of lower electrode provided on a support in advance, and (c) is a perspective view showing an appearance of a Peltier cooling element obtained by adhering (a) and (b) (provided that a part of the electrode part is omitted).

FIG. 1 shows one example of the Peltier cooling element of the present invention.

In FIG. 1, (a) shows a perspective view of a p-type and n-type thermoelectric element pattern film 1 constituting the Pelter cooling element 9, constituted by a support 2 having thereon a lower electrode 3 (including lower electrodes (for applying voltage) 3a and 3b for applying a direct electric current necessary for operation), and p-type thermoelectric elements 4 and n-type thermoelectric elements 5 (which each are disposed in the dotted arrow direction in 8 patterns respectively, i.e., 16 patterns in total, in FIG. 1(a)). In FIG. 1, (b) shows a perspective view of a counter electrode pattern film 6 constituting the Pelter cooling element 9, constituted by a support 7 having thereon a lower electrode 8 and an electroconductive adhesive layer (which is provided corresponding to the positions of the p-type thermoelectric elements 4 and the n-type thermoelectric elements 5 on the support 2, and is not shown in the figure). In FIG. 1, (c) shows an appearance of the Peltier cooling element 9, in which (a) and (b) are adhered in such a manner that the p-type thermoelectric elements 4 and the n-type thermoelectric elements 5 are disposed alternately, are electrically connected in series and are thermally connected in parallel to each other, so as to provide the Pelter cooling element 9 (which is generally referred to as a π-type thermoelectric conversion module).

Thermoelectric Conversion Material

The thermoelectric conversion material used in the Peltier cooling element of the present invention contains a support having thereon a thermoelectric semiconductor composition containing thermoelectric semiconductor fine particles, a heat resistant resin, and an ionic liquid.

The thermoelectric conversion material used in the Peltier cooling element of the present invention preferably contains p-type and n-type thermoelectric elements that are disposed alternately, and are electrically connected in series and thermally connected in parallel to each other, from the standpoint of the cooling capability and the cooling efficiency, and plural thermoelectric conversion materials may be used in such a range that does not impair the cooling effect.

Support

The support is not particularly limited as far as the support does not influence the decrease of the electroconductivity of the thermoelectric conversion material and the increase of the thermal conductivity thereof, and examples thereof include glass, silicon, and a plastic film. Among these, a plastic film is preferred from the standpoint of the excellent flexibility thereof.

Specific examples of the plastic film include a polyethylene terephthalate film, a polyethylene naphthalate film, a polyimide film, a polyamide film, a polyetherimide film, a polyaramid film, a polyamideimide film, a polyether ketone film, a polyether ether ketone film, a polyphenylene sulfide film, and a poly(4-methylpentene-1) film. The film may be a laminated material.

Among these, a polyimide film, a polyamide film, a polyetherimide film, a polyaramid film, and a polyamideimide film are preferred since the support is not thermally deformed, so as to retain the performance of the thermoelectric conversion material even in the case where the thin film formed of the thermoelectric semiconductor composition is subjected to an annealing treatment, and has high heat resistance and high dimensional stability, and a polyimide film is particularly preferred due to the high general versatility thereof.

The thickness of the support is preferably from 1 to 1,000 μm, more preferably from 10 to 500 μm, and further preferably from 20 to 100 μm, from the standpoint of the flexibility, the heat resistance, and the dimensional stability.

The plastic film preferably has a decomposition temperature of 300° C. or more.

Thermoelectric Semiconductor Fine Particles

The thermoelectric semiconductor fine particles used in the thermoelectric conversion material can be obtained by pulverizing a thermoelectric semiconductor material to a prescribed size with a fine pulverizing device or the like.

The thermoelectric semiconductor material is not particularly limited, and examples thereof used include a bismuth-tellurium-based thermoelectric semiconductor material, such as p-type bismuth telluride, n-type bismuth telluride, and $Bi_2Te_3$; a telluride-based thermoelectric semiconductor material, such as GeTe and PbTe; an antimony-tellurium-based thermoelectric semiconductor material; a zinc-antimony-based thermoelectric semiconductor material, such as ZnSb, $Zn_3Sb_2$, and $Zn_4Sb_3$; a silicon-germanium-based thermoelectric semiconductor material, such as SiGe; a bismuth selenide-based thermoelectric semiconductor material, such as $Bi_2Se_3$; a silicide-based thermoelectric semiconductor material, such as β-$FeSi_2$, $CrSi_2$, $MnSi_{1.73}$, and $Mg_2Si$; an oxide-based thermoelectric semiconductor material; a Heusler material, such as FeVAl, FeVAlSi, and FeVTiAl; and a sulfide-based thermoelectric semiconductor material, such as $TiS_2$.

Among these, the thermoelectric semiconductor material used in the present invention is preferably a bismuth-tellurium-based thermoelectric semiconductor material, such as p-type bismuth telluride, n-type bismuth telluride, and $Bi_2Te_3$.

The p-type bismuth telluride used preferably has a hole as a carrier, has a positive Seebeck coefficient, and is represented, for example, by $Bi_XTe_3Sb_{2-X}$. In this case, X is preferably $0<X\le0.8$, and more preferably $0.4\le X\le0.6$. The value X that is larger than 0 and 0.8 or less is preferred since the Seebeck coefficient and the electroconductivity are increased, and the characteristics as a p-type thermoelectric conversion material are retained.

The n-type bismuth telluride used preferably has an electron as a carrier, has a negative Seebeck coefficient, and is represented, for example, by $Bi_2Te_{3-Y}Se_Y$. In this case, Y is preferably $0\le Y\le3$, and more preferably $0\le Y\le2.7$. The value Y that is 0 or more and 3 or less is preferred since the Seebeck coefficient and the electroconductivity are increased, and the characteristics as an n-type thermoelectric conversion material are retained.

The amount of the thermoelectric semiconductor fine particles mixed in the thermoelectric semiconductor composition is preferably from 30 to 99% by mass, more preferably from 50 to 96% by mass, and further preferably from 70 to 95% by mass. The amount of the thermoelectric semiconductor fine particles mixed that is in the range is preferred since the absolute value of the Seebeck coefficient, i.e., the absolute value of the Peltier coefficient is large, and the electroconductivity is prevented from being decreased, whereas only the thermal conductivity is decreased, thereby providing a film that has a high thermoelectric performance and has a sufficient film strength and a sufficient flexibility.

The mean particle size of the thermoelectric semiconductor fine particles is preferably from 10 nm to 200 μm, more preferably from 10 nm to 30 μm, further preferably from 50 nm to 10 μm, and particularly preferably from 1 to 6 μm. When the mean particle size is in the range, the thermoelectric semiconductor fine particles can be easily uniformly dispersed to increase the electroconductivity.

The method of pulverizing the thermoelectric semiconductor material to provide the thermoelectric semiconductor fine particles is not particularly limited, and the material may be pulverized to a prescribed size with a known fine pulverizing device, such as a jet mill, a ball mill, a bead mill, a colloid mill, a conical mill, a disk mill, an edge mill, a grain mill, a hummer mill, a pellet mill, a wiley mill, and a roller mill.

The mean particle size of the thermoelectric semiconductor fine particles can be obtained by measuring with a laser diffraction particle size distribution measuring device (Model 1064, produced by Cilas Corporation), and the median value of the particle size distribution is designated thereto.

The thermoelectric semiconductor fine particles are preferably subjected to an annealing treatment (which may be hereinafter referred to as an "annealing treatment A"). The annealing treatment A performed may enhance the crystallinity of the thermoelectric semiconductor fine particles and may remove the surface oxide film of the thermoelectric semiconductor fine particles, and thereby the Seebeck coefficient of the thermoelectric conversion material, i.e., the Peltier coefficient thereof, can be increased to enhance further the figure of merit. The annealing treatment A is not particularly limited, and for preventing an adverse affect on the thermoelectric semiconductor fine particles before preparing the thermoelectric semiconductor composition, is preferably performed in an inert gas atmosphere, such as nitrogen or argon, with a controlled gas flow rate, or a reducing gas atmosphere, such as hydrogen, with a controlled gas flow rate, or under a vacuum condition, and more preferably performed in a mixed gas atmosphere of an inert gas and a reducing gas. The specific temperature condition depends on the thermoelectric semiconductor fine particles used, and the annealing treatment A is generally preferably performed at a temperature that is the melting point of the fine particles or less and is in a range of from 100 to 1,500° C., for a period of from several minutes to several tens of hours.

Ionic Liquid

The ionic liquid used in the present invention is a molten salt containing a combination of a cation and an anion, and is a salt capable of being present as a liquid within a wide temperature range of from −50 to 500° C. The ionic liquid has such characteristics as a considerably low vapor pressure, i.e., non-volatility, excellent thermal stability and electrochemical stability, a low viscosity, and high ionic conductivity, and thus can function as an electroconductive assistant capable of effectively suppressing the electroconductivity among the thermoelectric semiconductor fine particles from being decreased. The ionic liquid also exhibits a high polarity based on the aprotic ionic structure thereof, and is excellent in compatibility with the heat resistant resin, and thus the electroconductivity of the thermoelectric conversion material can be made uniform thereby.

The ionic liquid used may be a known or commerically available product. Examples thereof include combinations of a cation component, for example, a nitrogen-containing cyclic cation compound and a derivative thereof, such as pyridinium, pyrimidinium, pyrazolium, pyrrolidinium, piperidinium, and imidazolium; an amine cation and a derivative thereof, such as a tetraalkylammonium; a phosphine cation and a derivative thereof, such as phosphonium, trialkyl sulfonium, and tetraalkyl phosphonium; and a lithium cation and a derivative thereof, and an anion component, for example, a halide anion, such as a chloride ion, e.g., $Cl^-$, $AlCl_4^-$, $Al_2Cl_7^-$, and $ClO_4^-$, a bromide ion, e.g., $Br^-$, an iodide ion, e.g., $I^-$, a fluoride ion, e.g., $BF_4^-$ and $PF_6^-$, and $F(HF)_n^-$, $NO_3^-$, $CH_3COO^-$, $CF_3COO^-$, $CH_3SO_3^-$, $CF_3SO_3^-$, $(FSO_2)_2N^-$, $(CF_3SO_2)_2N^-$, $(CF_3SO_2)_3C^-$, $AsF_6^-$, $SbF_6^-$, $NbF_6^-$, $TaF_6^-$, $F(HF)n^-$, $(CN)_2N^-$, $C_4F_9SO_3^-$, $(C_2F_5SO_2)_2N^-$, $C_3F_7COO^-$, and $(CF_3SO_2)(CF_3CO)N^-$.

Among the ionic liquids, from the standpoint of the high temperature stability, the compatibility with the thermoelectric semiconductor fine particles and the resin, the suppression of the decrease of the electroconductivity of the voids among the thermoelectric semiconductor fine particles, and the like, the cation component of the ionic liquid preferably contains at least one selected from a pyridinium cation and a derivative thereof, and an imidazolium cation and a derivative thereof. The anion component of the ionic liquid preferably contains a halide anion, and more preferably contains at least one selected from $Cl^-$, $Br^-$, and $I^-$.

Specific examples of the ionic liquid containing a cation component that contains a pyridinium cation or a derivative thereof include 4-methyl-butylpyridinium chloride, 3-methyl-butylpyridinium chloride, 4-methyl-hexylpyridinium chloride, 3-methyl-hexylpyridinium chloride, 4-methyl-octylpyridinium chloride, 3-methyl-octylpyridinium chloride, 3,4-dimethyl-butylpyridinium chloride, 3,5-dimethyl-butylpyridinium chloride, 4-methyl-butylpyridinium tetrafluoroborate, 4-methyl-butylpyridinium hexafluorophosphate, 1-butyl-4-methylpyridinium bromide, 1-butyl-4-methylpyridinium hexafluorophosphate, and 1-butyl-4-methylpyridinium iodide. Among these, 1-butyl-4-methylpyridinium bromide, 1-butyl-4-methylpyridinium hexafluorophosphate, and 1-butyl-4-methylpyridinium iodide are preferred.

Specific examples of the ionic liquid containing a cation component that contains an imidazolium cation or a derivative thereof include [1-butyl-3-(2-hydroxyethyl)imidazolium bromide], [1-butyl-3-(2-hydroxyethyl)imidazolium tetrafluoroborate], 1-ethyl-3-methylimidazolium chloride, 1-ethyl-3-methylimidazolium bromide, 1-butyl-3-methylimidazolium chloride, 1-hexyl-3-methylimidazolium chloride, 1-octyl-3-methylimidazolium chloride, 1-decyl-3-methylimidazolium chloride, 1-decyl-3-methylimidazolium bromide, 1-dodecyl-3-methylimidazolium chloride, 1-tetradecyl-3-methylimidazolium chloride, 1-ethyl-3-methylimidazolium tetrafluoroborate, 1-butyl-3-methylimidazolium tetrafluoroborate, 1-hexyl-3-methylimidazolium tetrafluoroborate, 1-ethyl-3-methylimidazolium hexafluorophosphate, 1-butyl-3-methylimidazolium hexafluorophosphate, 1-methyl-3-butylimidazolium methylsulfate, and 1,3-dibutylimidazolium methyl sulfate. Among these, [1-butyl-3-(2-hydroxyethyl)imidazolium bromide] and [1-butyl-3-(2-hydroxyethyl)imidazolium tetrafluoroborate] are preferred.

The ionic liquid preferably has an electroconductivity of $10^{-7}$ S/cm or more, and more preferably $10^{-6}$ S/cm or more. When the ionic conductivity is in the range, the ionic liquid can function as an electroconductive assistant capable of effectively suppressing the electroconductivity among the thermoelectric semiconductor fine particles from being decreased.

The ionic liquid preferably has a decomposition temperature of 300° C. or more. When the decomposition temperature is in the range, the effect of the electroconductive assistant can be retained even in the case where the thin film formed of the thermoelectric semiconductor composition is subjected to an annealing treatment, as described later.

The ionic liquid preferably has a mass reduction rate at 300° C. by a thermogravimetric measurement (TG) of 10% or less, more preferably 5% or less, and further preferably 1% or less. When the mass reduction rate is in the range, the effect of the electroconductive assistant can be retained even in the case where the thin film formed of the thermoelectric semiconductor composition is subjected to an annealing treatment, as described later.

The amount of the ionic liquid mixed in the thermoelectric semiconductor composition is preferably from 0.01 to 50% by mass, more preferably from 0.5 to 30% by mass, and further preferably from 1.0 to 20% by mass. When the amount of the ionic liquid mixed is in the range, the decrease of the electroconductivity can be effectively suppressed, thereby providing a film having a high thermoelectric performance.

Heat Resistant Resin

The heat resistant resin used in the present invention functions as a binder among the thermoelectric semiconductor fine particles, so as to enhance the flexibility of the thermoelectric conversion material. The heat resistant resin is not particularly limited, and may be a heat resistant resin that retains the properties thereof including the mechanical strength, the thermal conductivity, and the like, without deterioration thereof, in the case where crystal growth of the thermoelectric semiconductor fine particles is performed by the annealing treatment or the like of the thin film formed of the thermoelectric semiconductor composition.

Examples of the heat resistant resin include a polyamide resin, a polyamideimide resin, a polyimide resin, a polyetherimide resin, a polybenzoxazole resin, a polybenzimidazole resin, an epoxy resin, and copolymers having chemical structures of the resins. The heat resistant resin may be used solely or as a combination of two or more kinds thereof. Among these, a polyamide resin, a polyamideimide resin, a polyimide resin, and an epoxy resin are preferred since the resins have higher heat resistance and do not adversely affect the crystal growth of the thermoelectric semiconductor fine particles in the thin film, and a polyamide resin, a polyamideimide resin, and a polyimide resin are more preferred since the resins are excellent in flexibility. In the case where a polyimide film is used as the support, a polyimide resin is more preferred as the heat resistant resin due to the adhesion to the polyimide film, and the like. In the present invention, the polyimide resin is a generic term of polyimide and a precursor thereof.

The heat resistant resin preferably has a decomposition temperature of 300° C. or more. When the decomposition temperature is in the range, the function of the binder is not lost, and the flexibility of thermoelectric conversion material can be retained even in the case where the thin film formed of the thermoelectric semiconductor composition is subjected to an annealing treatment, as described later.

The heat resistant resin preferably has a mass reduction rate at 300° C. by a thermogravimetric measurement (TG) of 10% or less, more preferably 5% or less, and further preferably 1% or less. When the mass reduction rate is in the range, the function of the binder is not lost, and the flexibility of thermoelectric conversion material can be retained even in the case where the thin film formed of the thermoelectric semiconductor composition is subjected to an annealing treatment, as described later.

The amount of the heat resistant resin mixed in the thermoelectric semiconductor composition may be from 0.1 to 40% by mass, preferably from 0.5 to 20% by mass, more preferably from 1 to 20% by mass, and further preferably from 2 to 15% by mass. When the amount of the heat resistant resin mixed is in the range, a thin film that achieves both a high thermoelectric performance and a high film strength can be obtained.

The thermoelectric semiconductor composition used in the present invention may contain other additives, such as a dispersant, a film forming assistant, a light stabilizer, an antioxidant, a tackifier, a plasticizer, a colorant, a resin stabilizer, a filler, a pigment, an electroconductive filler, an electroconductive polymer, and a curing agent, depending on necessity, in addition to the thermoelectric semiconductor fine particles, the heat resistant resin, and the ionic liquid. The additives may be used solely or as a combination of two or more kinds thereof.

The preparation method of the thermoelectric semiconductor composition used in the present invention is not particularly limited, and the thermoelectric semiconductor composition may be prepared by mixing and dispersing the thermoelectric semiconductor fine particles, the ionic liquid, and the heat resistant resin, to which the additives and further a solvent may be added depending on necessity, by a known method, such as an ultrasonic homogenizer, a spiral mixer, a planetary mixer, a disperser, and a hybrid mixer.

Examples of the solvent include toluene, ethyl acetate, methyl ethyl ketone, an alcohol, tetrahydrofuran, methylpyrrolidone, and ethyl cellosolve. The solvent may be used solely or as a mixture of two or more kinds thereof. The solid concentration of the thermoelectric semiconductor composition is not particularly limited, and may be such a value that provides a viscosity suitable for coating the composition.

The thin film formed of the thermoelectric semiconductor composition may be formed by coating the thermoelectric semiconductor composition on the support, and dried, as described for the manufacture method of the Peltier cooling element described later. In the formation in this manner, a thermoelectric conversion material with a large area can be easily obtained at low cost.

The thickness of the thin film formed of the thermoelectric semiconductor composition is not particularly limited, and is preferably from 100 nm to 200 μm, more preferably from 300 nm to 150 μm, and further preferably from 5 μm to 150 μm, from the standpoint of the thermoelectric performance and the film strength.

Manufacture Method of Peltier Cooling Element

The manufacture method of a Peltier cooling element of the present invention is a method for manufacturing a Peltier cooling element containing a thermoelectric conversion material containing a support having thereon a thin film containing a thermoelectric semiconductor composition containing thermoelectric semiconductor fine particles, a heat resistant resin, and an ionic liquid, the method containing: a step of coating a thermoelectric semiconductor composition containing thermoelectric semiconductor fine particles, a heat resistant resin, and an ionic liquid, on a support, and drying, so as to form a thin film; and a step of subjecting the thin film to an annealing treatment.

The process steps contained in the present invention will be described below.

Thin Film Forming Step

The method of coating the thermoelectric semiconductor composition used in the present invention on the support is not particularly limited, and examples thereof include known methods, such as screen printing, flexo printing, gravure printing, spin coating, dip coating, die coating, spray coating, bar coating, and doctor blade coating. In the case where the coated film is formed in a pattern, screen printing, slot die coating, and the like are preferably used since a pattern can be easily formed with a screen printing plate having a desired pattern.

Subsequently, the resulting coated film is dried to provide a thin film, and the drying method used may be a known method, such as hot air drying, heat roll drying and infrared ray irradiation. The heating temperature is generally from 80 to 150° C., and the heating time is generally from several seconds to several tens of minutes while it varies depending on the heating method.

In the case where a solvent is used for preparing the thermoelectric semiconductor composition, the heating temperature is not particularly limited within such a range that is capable of drying the solvent used.

Annealing Step

After forming the thin film, the resulting thermoelectric conversion material is further subjected to an annealing treatment (which may be hereinafter referred to as an "annealing treatment B"). The annealing treatment B performed can stabilize the thermoelectric performance and can perform crystal growth of the thermoelectric semiconductor fine particles in the thin film, thereby further enhancing the thermoelectric performance. The annealing treatment B is not particularly limited, and is generally performed in an inert gas atmosphere, such as nitrogen or argon, with a controlled gas flow rate, or a reducing gas atmosphere, such as hydrogen, with a controlled gas flow rate, or under a vacuum condition, and is preferably performed at a temperature of from 100 to 500° C. for from several minutes to several tens of hours in a mixed gas atmosphere of an inert gas and a reducing gas, while depending on the heat resistant temperatures of the resin and the ionic liquid used, and the like.

Adhering Step

An adhering step is a step of adhering the two kinds of supports described later including the thin film obtained through the annealing treatment step, so as to produce a Peltier cooling element. The structure of the Peltier cooling element is not particularly limited, and may be constituted, for example, in such a manner that p-type thermoelectric elements and n-type thermoelectric elements are disposed alternately, and are electrically connected in series and thermally connected in parallel to each other. As the pair of the p-type thermoelectric element and the n-type thermoelectric element, plural pairs may be used depending on the purpose.

In view of the structures of the thermoelectric elements, the lower electrodes, and the like on the supports used in the adhering step, the adhesion may be performed, for example, by using the two kinds of supports in the manner (1) or (2) shown below.

(1) The support having a lower electrode pattern and p-type and n-type thermoelectric element patterns having been subjected to the annealing treatment (for example, (a) in FIG. 1) and the support having a lower electrode pattern (for example, (b) in FIG. 1) are adhered through an adhesive in such a manner that, after the adhesion, the p-type thermoelectric elements and the n-type thermoelectric elements are disposed alternately, and are electrically connected in series and thermally connected in parallel to each other (for example (c) in FIG. 1).

(2) The support having a lower electrode pattern and a p-type thermoelectric element pattern having been subjected to the annealing treatment and the support having a lower electrode pattern and an n-type thermoelectric element pattern having been subjected to the annealing treatment are adhered through an adhesive in such a manner that provides the same structure as (1) above after the adhesion.

The production in the manner (1) above is preferred since the productivity thereof is higher than the production in the manner (2) due to such reasons that the annealing treatment at a high temperature may be performed for only one support having the thermoelectric elements, the alignment on adhesion (i.e., the control of the overlap position) can be easily performed, and the like, and this leads to cost reduction.

The adhesive is not particularly limited, and examples thereof include an electroconductive paste and an electroconductive adhesive. Examples of the electroconductive paste include a copper paste, a silver paste, and a nickel paste, and examples of the electroconductive adhesive include an epoxy resin adhesive, an acrylic resin adhesive, and a urethane resin adhesive.

According to the manufacture method of the present invention, a Peltier cooling element using a thermoelectric conversion material having a high thermoelectric performance can be obtained in a convenient method at low cost.

EXAMPLES

The present invention will be described in more detail with reference to examples below, but the present invention is not limited to the examples.

The evaluation of the thermoelectric performance and the evaluation of the flexibility of the thermoelectric conversion materials produced in Examples and Comparative Examples and the evaluation of the cooling characteristics of the Peltier cooling elements produced therein were performed in the following manners.

Evaluation of Thermoelectric Performance (a) Electric Conductivity

The thermoelectric conversion materials produced in Examples and Comparative Examples were measured for the surface resistivity of the specimen by the four-terminal method with a surface resistivity measuring device (Loresta GP MCP-T600, produced by Mitsubishi Chemical Corporation), and the electroconductivity ($\sigma$) was calculated.

(b) Seebeck Coefficient

The thermoelectric conversion materials produced in Examples and Comparative Examples were measured for the thermal electromotive force according to JIS C2527: 1994, and the Seebeck coefficient (5) was calculated. One end of the thermal conversion material produced was heated, the temperature difference formed between the both ends of the thermal conversion material was measured with a chromel-alumel thermocouple, and the thermal electromotive force was measured with an electrode adjacent to the position where the thermocouple was provided.

Specifically, with the distance between the both ends of the specimen to be measured for the temperature difference and the electromotive force of 25 mm, one end was retained at 20° C., whereas the other end was heated to from 25° C. to 50° C. with a step of 1° C., at which the thermal electromotive force was measured, and the Seebeck coefficient (S) was calculated from the gradient thereof. The positions where the thermocouple and the electrode were provided were symmetrical to each other with respect to the center line of the thin film, and the distance between the thermocouple and the electrode was 1 mm.

(c) Thermal Conductivity

For the measurement of the thermal conductivity, the thermal conductivity ($\lambda$) was calculated by the $3\omega$ method.

The figure of merit Z ($Z=\sigma S^2/\lambda$) was obtained from the electroconductivity, the Seebeck coefficient, and the thermal conductivity thus obtained, and the non-dimensional figure of merit ZT (T=300 K) was calculated.

Evaluation of Cooling Characteristics

Figure 2:
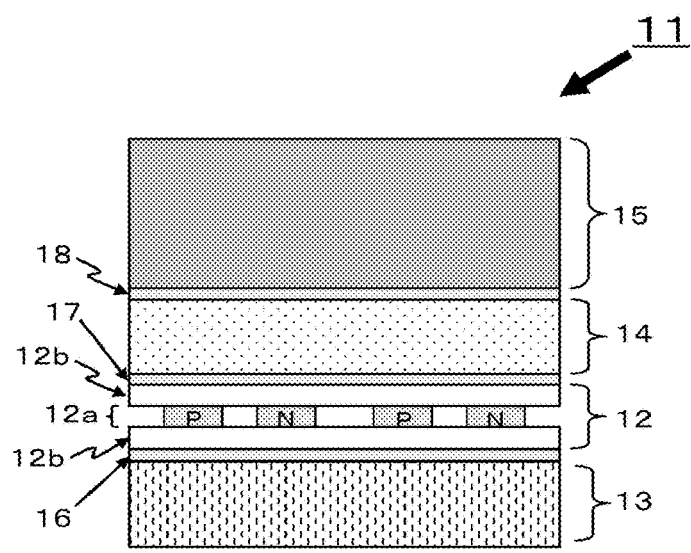
FIG. 2 is a cross sectional structural view showing one example of a unit for evaluating the cooling characteristics of the Peltier cooling element of the present invention.

Peltier cooling elements (π-type thermoelectric conversion modules) constituted by the p-type and n-type thermoelectric elements produced in Examples and Comparative Examples were evaluated for the cooling characteristics by disposing the prescribed position of a unit for evaluating the cooling characteristics 11 shown in FIG. 2.

Specifically, the cooling side (heat absorption side) of the Peltier cooling element 12 was adhered to a heating unit 13 as the adherend, and on the waste heat side (heat radiation side) thereof, a chiller unit 15 (temperature of cooling water: 0° C.) was disposed via a heatsink 14. Heat of 3 W was fed from the heating unit 13, and the temperature difference between the cooling side of the Peltier cooling element 12 and the waste heat side of the Peltier cooling element was measured on application of a voltage of 0.5 V from a direct current power supply to the both ends of the thermoelectric element of the Peltier cooling element 12.

Thermal conductive grease 16 was disposed between the heating unit 13 and the Peltier cooling element 12, thermal conductive grease 17 was disposed between the Peltier cooling element 12 and the heatsink 14, and thermal conductive grease 18 was disposed between the heatsink 14 and the chiller unit 15, whereby the thermal resistance was suppressed low by preventing the air from being entrained at the interfaces.

Evaluation of Flexibility

The thermoelectric conversion materials produced in Examples and Comparative Examples were evaluated for the flexibility of the thin film by the cylindrical mandrel method with a mandrel diameter of 10 mm. The appearance and the thermoelectric performance of the thermoelectric conversion material were evaluated before and after the cylindrical mandrel test, and the flexibility was evaluated by the following standard.

AA: No abnormality was found on the appearance of the thermoelectric conversion material, and the non-dimensional figure of merit ZT thereof was not changed, before and after the test.

A: No abnormality was found on the appearance of the thermoelectric conversion material, and the decrease of ZT thereof was less than 30%, before and after the test.

B: Breakage, such as cracks, occurred in the thermoelectric conversion material, and ZT was decreased by 30% or more, after the test.

Manufacture Method of Thermoelectric Semiconductor Fine Particles p-Type bismuth telluride $Bi_{0.4}Te_3Sb_{1.6}$ (produced by Kojundo Chemical Laboratory Co., Ltd., particle size: 180 μm), which was a bismuth-tellurium-based thermoelectric semiconductor material, was pulverized in a nitrogen gas atmosphere with a planetary ball mill (Premium line P-7, produced by Fritsch Japan Co., Ltd.), so as to produce thermoelectric semiconductor fine particles T1 having a mean particle size of 1.2 μm. The thermoelectric semiconductor fine particles thus obtained through pulverization were measured for the particle size distribution with a laser diffraction particle size distribution measuring device (Model 1064, produced by Cilas Corporation).

n-Type bismuth telluride $Bi_2Te_3$ (produced by Kojundo Chemical Laboratory Co., Ltd., particle size: 180 μm), which was a bismuth-tellurium-based thermoelectric semiconductor material, was pulverized in the same manner as above, so as to produce thermoelectric semiconductor fine particles T2 having a mean particle size of 1.4 μm.

Example 1

(1) Production of Thermoelectric Semiconductor Composition

The resulting bismuth-tellurium-based thermoelectric semiconductor material fine particles T1, polyamic acid (produced by Sigma-Aldrich Co. LLC, solution of poly (pyromellitic dianhydride-co-4,4'-oxydianiline), solid concentration: 15% by mass, solvent: methylpyrrolidone, mass reduction rate at 300° C.: 0.9%), which was a polyimide precursor, as the heat resistant resin, and [1-butyl-3-(2-hydroxyethyl)imidazolium bromide] (electroconductivity: $3.5 \times 10^{-5}$ S/cm) as the ionic liquid 1 were mixed and dispersed to make the formulation shown in Table 1, so as to prepare a coating liquid P formed of a thermoelectric semiconductor composition containing the p-type bismuth telluride fine particles T1. Similarly, a coating liquid N formed of a thermoelectric semiconductor composition containing the n-type bismuth telluride fine particles T2 was prepared by changing the fine particles T1 to the fine particles T2.

(2) Production of Specimen for Evaluating Thermoelectric Performance

The coating liquid P prepared in (1) was coated on a polyimide film (produced by Du Pont-Toray Co., Ltd., Kapton, a trade name, thickness: 50 μm) as the support by screen printing, and dried at a temperature of 150° C. for 10 minutes in an argon atmosphere, so as to form a thin film having a thickness of 10 μm. Subsequently, for the resulting thin film, the annealing treatment B after the formation of the thin film was performed by heating in an atmosphere of a mixed gas of hydrogen and argon (hydrogen/argon=5% by volume/95% by volume) at a heating rate of 5 K/min and retaining therein at 415° C. for 1 hour, thereby performing crystal growth of the fine particles of the thermoelectric semiconductor material, so as to produce a p-type thermoelectric conversion material. An n-type thermoelectric conversion material was produced in the same manner by using the coating liquid N prepared in (1).

(3) Production of Peltier Cooling Element (π-Type Thermoelectric Conversion Module)

On a polyimide film (produced by Du Pont-Toray Co., Ltd., Kapton, a trade name, thickness: 50 μm) as a support having a lower electrode (copper electrode pattern) similar as in (a) in FIG. 1 formed in advance by a screen printing method, the coating liquid P and the coating liquid N produced in (1) were coated by the screen printing method to form p-type and n-type thermoelectric element patterns similar as in (a) in FIG. 1, which were dried at a temperature of 150° C. for 10 minutes in an argon atmosphere, so as to form thin films each having a thickness of 100 μm. For the resulting thin films, the annealing treatment B was performed by heating in an argon gas atmosphere at a heating rate of 5 K/min and retaining therein at 415° C. for 1 hour, thereby performing crystal growth of the fine particles of the thermoelectric semiconductor material, so as to produce a p-type and n-type thermoelectric element pattern film.

Subsequently, on a polyamide film (produced by Du Pont-Toray Co., Ltd., Kapton, a trade name, thickness: 50 μm) as another support, a lower electrode pattern similar as in (b) in FIG. 1 was coated by a screen printing method, so as to produce a counter electrode pattern film.

The p-type and n-type thermoelectric element pattern film and the counter electrode pattern film thus obtained were adhered through an electroconductive adhesive (produced by Nihon Handa Co., Ltd., ECA100, a trade name, thickness: 20 μm) in such a manner that the p-type thermoelectric elements and the n-type thermoelectric elements were disposed alternately, and were electrically connected in series and thermally connected in parallel to each other, so as to produce a Peltier cooling element similar as in (c) in FIG. 1.

Example 2

A p-type thermoelectric conversion material, an n-type thermoelectric conversion material, and a Peltier cooling element were produced in the same manner as in Example 1 except that the ionic liquid (ionic liquid 1) was changed from 1-butyl-3-(2-hydroxyethyl)imidazolium bromide to 1-butyl-4-methylpyridinium iodide (produced by Sigma-Aldrich Co. LLC, ionic liquid 2, electroconductivity: $1.8 \times 10^{-5}$ S/cm).

Example 3

A p-type thermoelectric conversion material, an n-type thermoelectric conversion material, and a Peltier cooling element were produced in the same manner as in Example 1 except that the amounts of the p-type thermoelectric semiconductor fine particles and the n-type thermoelectric semiconductor fine particles each were changed to 85% by mass, and the amount of the ionic liquid 1 added was changed to 10% by mass.

Example 4

A p-type thermoelectric conversion material, an n-type thermoelectric conversion material, and a Peltier cooling element were produced in the same manner as in Example 1 except that the amounts of the p-type thermoelectric semiconductor fine particles and the n-type thermoelectric semiconductor fine particles each were changed to 55% by mass, and the amount of the ionic liquid 1 added was changed to 40% by mass.

Comparative Example 1

A p-type thermoelectric conversion material, an n-type thermoelectric conversion material, and a Peltier cooling element were produced in the same manner as in Example 1 except that the ionic liquid was not added, and the amount of the polyimide resin mixed was changed from 5% by mass to 10% by mass.

Comparative Example 2

Coating liquids containing a thermoelectric semiconductor composition each were prepared in such a manner that a mixture PEDOT:PSS of poly(3,4-ethylenedioxythiophene) as an electroconductive polymer and polystyrenesulfonate ion, the ionic liquid 1, and the thermoelectric semiconductor fine particles were mixed and dispersed to make the formulation shown in Table 1, with no heat resistant resin added, and a p-type thermoelectric conversion material, an n-type thermoelectric conversion material, and a Peltier cooling element were produced.

Comparative Example 3

A p-type thermoelectric conversion material, an n-type thermoelectric conversion material, and a Peltier cooling element were produced in the same manner as in Example 1 except that the heat resistant resin was changed to polystyrene (mass reduction rate at 300° C.: 100%).

TABLE 1

| | Thermoelectric semiconductor fine particles | | | | | Heat resistant resin | | Ionic liquid | | Electroconductive |
|---|---|---|---|---|---|---|---|---|---|---|
| | | Mean particle size (μm) | Amount mixed (% by mass) | | Mean particle size (μm) | Amount mixed (% by mass) | Kind | Amount mixed (% by mass) | Kind | Amount mixed (% by mass) | polymer PEDOT:PSS (% by mass) |
| | p-Type | | | n-Type | | | | | | | |
| Example 1 | T1 | 1.2 | 90 | T2 | 1.4 | 90 | polyimide resin | 5 | ionic liquid 1 | 5 | — |
| Example 2 | T1 | 1.2 | 90 | T2 | 1.4 | 90 | polyimide resin | 5 | ionic liquid 2 | 5 | — |
| Example 3 | T1 | 1.2 | 85 | T2 | 1.4 | 85 | polyimide resin | 5 | ionic liquid 1 | 10 | — |
| Example 4 | T1 | 1.2 | 55 | T2 | 1.4 | 55 | polyimide resin | 5 | ionic liquid 1 | 40 | — |
| Comparative Example 1 | T1 | 1.2 | 90 | T2 | 1.4 | 90 | polyimide resin | 10 | — | — | — |
| Comparative Example 2 | T1 | 1.2 | 90 | T2 | 1.4 | 90 | — | — | ionic liquid 1 | 5 | 5 |
| Comparative Example 3 | T1 | 1.2 | 90 | T2 | 1.4 | 90 | polystyrene | 5 | ionic liquid 1 | 5 | — |

The results of the evaluation of the thermoelectric performance and the evaluation of the flexibility of the p-type thermoelectric conversion material and the n-type thermoelectric conversion material produced in Examples 1 to 4 and Comparative Examples 1 to 3 and the evaluation of the cooling characteristics of the Peltier cooling elements (π-type thermoelectric conversion modules) produced therein are shown in Table 2.

TABLE 2

| | | Evaluation of thermoelectric performance | | | | | | | | Evaluation of cooling characteristics Peltier cooling element | | |
| --- | --- | --- | --- | --- | --- | --- | --- | --- | --- | --- | --- | --- | --- |
| | | p-Type | | | | n-Type | | | | | | | |
| | Annealing treatment B | Electro-conductivity (S/cm) | Seebeck coefficient (μV/K) | Thermal conductivity (W/m·K) | ZT (300K) | Electro-conductivity (S/cm) | Seebeck coefficient (μV/K) | Thermal conductivity (W/m·K) | ZT (300K) | Evaluation of flexibility | Cooling side (°C.) | Waste heat side (°C.) |
| Example 1 | yes | 180 | 245 | 0.31 | 1 | 148 | −165 | 0.3 | 0.4 | AA | −10 | 10 |
| Example 2 | yes | 145 | 245 | 0.3 | 0.8 | 220 | −165 | 0.3 | 0.6 | AA | −10 | 10 |
| Example 3 | yes | 125 | 200 | 0.3 | 0.5 | 100 | −140 | 0.3 | 0.2 | AA | −5 | 7 |
| Example 4 | yes | 78 | 160 | 0.3 | 0.2 | 100 | −110 | 0.3 | 0.1 | AA | 0 | 5 |
| Comparative Example 1 | yes | 4 | 220 | 0.27 | 0.02 | 10 | −110 | 0.3 | 0.01 | AA | 40 | 80 |
| Comparative Example 2 | yes | 0.26 | 100 | 0.45 | $2.0 \times 10^{-4}$ | 0.06 | −50 | 0.45 | $1.0 \times 10^{-5}$ | B | — | — |
| Comparative Example 3 | yes | 0.004 | 200 | — | — | 0.001 | −140 | — | — | B | — | — |

It was found that the thermoelectric conversion materials of Example 1 to 4, as compared to Comparative Example 1 with no ionic liquid added, each had a higher non-dimensional figure of merit ZT by one order of magnitude or more, did not suffer breakage, such as cracks, in the thermoelectric conversion material and reduction of the non-dimensional figure of merit ZT before and after the cylindrical mandrel test, and were excellent in flexibility. Furthermore, it was found that the non-dimensional figure of merit ZT and the flexibility thereof were much excellent as compared to Comparative Example 2 with no heat resistant resin used (using only an electroconductive polymer with low heat resistance).

It was found that the Peltier cooling elements of Examples 1 to 4, as compared to Comparative Example 1 with no ionic liquid added, each were excellent in cooling effect since the temperature difference between the cooling side (heat absorption side) and the waste heat side (heat radiation side) was small.

INDUSTRIAL APPLICABILITY

The Peltier cooling element of the present invention can be easily manufactured at low cost and is constituted by using a thermoelectric conversion material excellent in thermoelectric performance, and therefore may be applied to a purpose suppressing heat accumulation caused through miniaturization and compactification of electronic devices. For example, the Peltier cooling element may be used for temperature control of various sensors, such as CCD (charge coupled device), MEMS (microelectromechanical system), and a light receiving element, which are semiconductor elements, temperature control of a laser for light communication and a high power laser for industrial use, temperature control of a silicon wafer and a reagent solution in the semiconductor field, and the like.

REFERENCE SIGNS LIST 1 p-type and n-type thermoelectric element pattern film
2 support
3 lower electrode
3a, 3b lower electrode (for application of voltage)
4 p-type thermoelectric element
5 n-type thermoelectric element
6 counter electrode pattern film
7 support
8 lower electrode (counter electrode)
9 Peltier cooling element (π-type thermoelectric conversion module)
11 unit for evaluating cooling characteristics
12 Peltier cooling element (π-type thermoelectric conversion module)
12a p-type and n-type thermoelectric elements
12b support
13 heating unit
14 heatsink
15 chiller unit
16, 17, 18 thermal conductive grease

The invention claimed is:

1. A Peltier cooling element, comprising a thermoelectric conversion material comprising a support having thereon a thin film comprising a thermoelectric semiconductor composition comprising:
   thermoelectric semiconductor fine particles;
   a heat resistant resin; and
   an ionic liquid,
   wherein:
   the thermoelectric semiconductor composition does not contain an electroconductive polymer; and
   an amount of the thermoelectric semiconductor fine particles is from 30 to 99% by mass in the thermoelectric semiconductor composition.

2. The Peltier cooling element according to claim 1, wherein an amount of the ionic liquid is from 0.01 to 50% by mass in the thermoelectric semiconductor composition.

3. The Peltier cooling element according to claim 1, wherein the ionic liquid comprises at least one cation selected from the group consisting of a pyridinium cation, a derivative of a pyridinium cation, an imidazolium cation, and a derivative of an imidazolium cation.

4. The Peltier cooling element according to claim 1, wherein the ionic liquid comprises a halide anion.

5. The Peltier cooling element according to claim 4, wherein the halide anion comprises at least one anion selected from the group consisting of Cl⁻, Br⁻, and I⁻.

6. The Peltier cooling element according to claim 1, wherein the heat resistant resin is at least one selected from the group consisting of a polyamide resin, a polyamideimide resin, a polyimide resin, and an epoxy resin.

7. The Peltier cooling element according to claim 1, wherein a mean particle size of the thermoelectric semiconductor fine particles is from 10 nm to 200 μm.

8. The Peltier cooling element according to claim 1, wherein the thermoelectric semiconductor fine particles are fine particles of a bismuth-tellurium-based thermoelectric semiconductor material.

9. The Peltier cooling element according to claim 1, wherein the support is a plastic film.

10. The Peltier cooling element according to claim 9, wherein the plastic film is at least one selected from the group consisting of a polyimide film, a polyamide film, a polyetherimide film, a polyaramid film, and a polyamideimide film.

11. A method for manufacturing a Peltier cooling element comprising a thermoelectric conversion material comprising a support having thereon a thin film comprising a thermoelectric semiconductor composition comprising thermoelectric semiconductor fine particles, a heat resistant resin, and an ionic liquid,
the method comprising:
coating the thermoelectric semiconductor composition on the support, and drying, so as to form the thin film; and
subjecting the thin film to an annealing treatment,
wherein:
the thermoelectric semiconductor composition does not contain an electroconductive polymer; and
an amount of the thermoelectric semiconductor fine particles is from 30 to 99% by mass in the thermoelectric semiconductor composition.

12. The method according to claim 11, wherein the support is a plastic film.

* * * * *